US012088255B2

(12) United States Patent
Yang et al.

(10) Patent No.: US 12,088,255 B2
(45) Date of Patent: Sep. 10, 2024

(54) DOHERTY AMPLIFIERS AND AMPLIFIER MODULES WITH SHUNT INDUCTOR AND CAPACITOR CIRCUIT FOR IMPROVED CARRIER HARMONIC LOADING

(71) Applicant: NXP USA, Inc., Austin, TX (US)

(72) Inventors: Nick Yang, Cincinnati, OH (US); Yu-Ting David Wu, Schaumburg, IL (US); Joseph Gerard Schultz, Wheaton, IL (US)

(73) Assignee: NXP USA, Inc., Austin, TX (US)

( * ) Notice: Subject to any disclaimer, the term of this patent is extended or adjusted under 35 U.S.C. 154(b) by 548 days.

(21) Appl. No.: 17/344,789

(22) Filed: Jun. 10, 2021

(65) Prior Publication Data

US 2022/0399856 A1     Dec. 15, 2022

(51) Int. Cl.
*H03F 3/45* (2006.01)
*H03F 1/02* (2006.01)
*H03F 3/21* (2006.01)

(52) U.S. Cl.
CPC ........... *H03F 1/0288* (2013.01); *H03F 3/211* (2013.01)

(58) Field of Classification Search
CPC .. H03F 1/0288; H03F 3/211; H03F 2200/451; H03F 3/195; H01L 24/48; H01L 24/49; H01L 2223/6611; H01L 2223/6644; H01L 2223/665; H01L 2223/6655; H01L 2223/6683; H01L 2224/48091; H01L 2224/48227; H01L 2224/49111; H01L 2224/49175; H01L 2924/00014; H01L 2924/181; H01L 2924/19105; H01L 23/66

USPC .......................................................... 330/295
See application file for complete search history.

(56) References Cited

U.S. PATENT DOCUMENTS

| | | | |
|---|---|---|---|
| 7,663,435 B2 | 2/2010 | Kim | |
| 10,284,147 B2 | 5/2019 | Wu et al. | |
| 10,498,292 B1 | 12/2019 | Krvavac | |
| 10,594,266 B2 | 3/2020 | Krehbiel et al. | |
| 2018/0175802 A1* | 6/2018 | Wu | H03F 1/56 |

OTHER PUBLICATIONS

Colantonio, Paolo et al; "GaN Doherty Amplifier With Compact Harmonic Traps"; Proceedings of the 3rd European Microwave Integrated Circuits Conference, Oct. 27-31, 2008, pp. 526-529, Amsterdam, The Netherlands.

* cited by examiner

*Primary Examiner* — Andrea Lindgren Baltzell
*Assistant Examiner* — Khiem D Nguyen

(57) ABSTRACT

A Doherty amplifier includes a peaking amplifier, a carrier amplifier, and a combining node electrically connected to the carrier amplifier and the peaking amplifier. The Doherty amplifier includes a harmonic control circuit coupled to the combining node. The harmonic control circuit includes an inductor and a capacitor and the inductor and capacitor are connected in series between the first current conducting terminal and a ground reference node. An inductance value of the inductor of the harmonic control circuit and a capacitance value of the capacitor of the harmonic control circuit are selected to terminate second order harmonic components of a fundamental frequency of a signal generated by the carrier amplifier.

20 Claims, 4 Drawing Sheets

DOHERTY AMPLIFIERS AND AMPLIFIER MODULES WITH SHUNT INDUCTOR AND CAPACITOR CIRCUIT FOR IMPROVED CARRIER HARMONIC LOADING

TECHNICAL FIELD

Embodiments of the subject matter described herein relate generally to radio frequency (RF) amplifiers and more particularly to Doherty amplifiers and Doherty amplifier modules.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over an air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

The high efficiency of the Doherty architecture makes the architecture desirable for current and next-generation wireless systems. When utilizing the Doherty architecture in power amplifiers, it can be important to provide adequate harmonic termination at the amplifier's carrier intrinsic drain. When a Doherty amplifier is implemented using laterally-diffused metal-oxide semiconductor (LDMOS)-based transistors operating at power levels ranging from 10 Watts (W) to 100 W, the architecture's carrier and peaking amplifiers can have relatively high parasitic drain-source capacitances (Cds) ranging from about 2.5 picoFarads (pF) to about 25 pF This relatively high value of Cds in the carrier amplifier's power transistor can operate to terminate harmonic signals at the amplifier's carrier intrinsic drain. Similarly, the high Cds of the peaking amplifier further operates as an isolating circuit to terminate harmonic frequencies generated at the carrier intrinsic drain and received at the peaking amplifier's drain terminal, which may serve as the Doherty amplifier's combining node. Such termination can be important in achieving high power efficiency in a Doherty amplifier system and may not be available in other amplifier implementations using different transistor technologies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
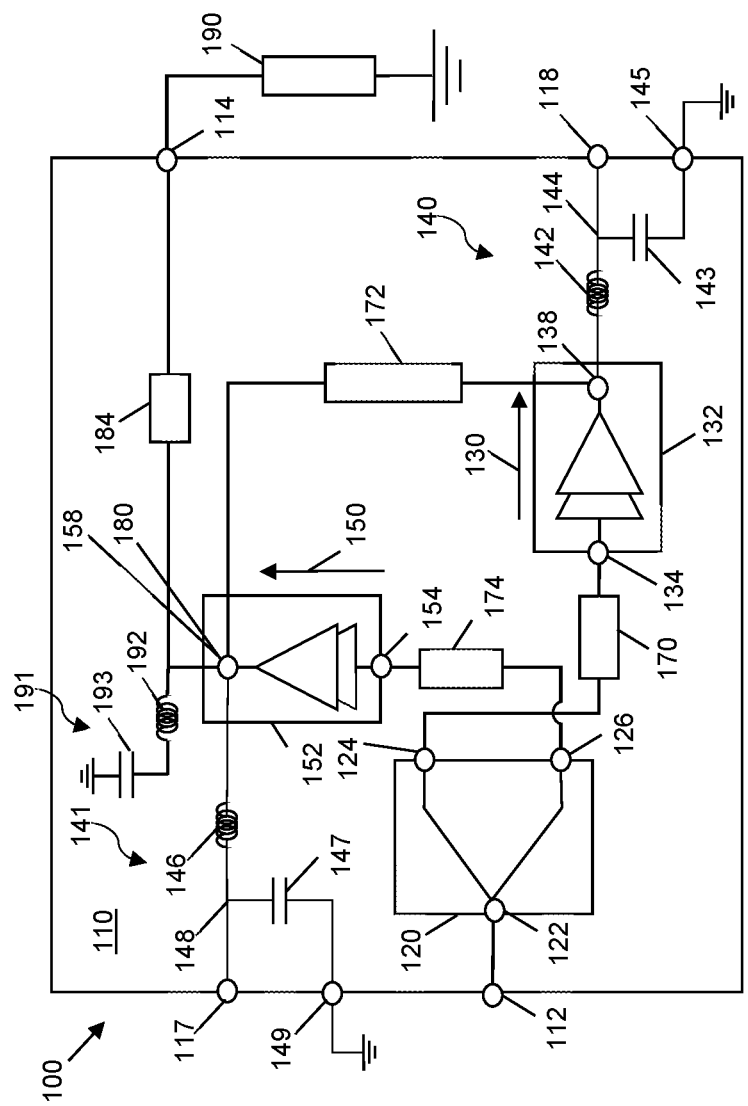
FIG. 1 is a schematic diagram of a Doherty amplifier, in accordance with an example embodiment.

A typical two-way Doherty amplifier implementation includes a radio frequency (RF) signal splitter configured to divide an input RF signal into two signals (referred to as a carrier signal and a peaking signal herein). The amplifier also includes parallel carrier and peaking amplifier paths configured to amplify the carrier and peaking signals, respectively, and a signal combiner configured to combine the amplified carrier and peaking signals. In addition, various phase shift and impedance inversion elements are disposed along the carrier and peaking amplifier paths. For example, in a typical non-inverted Doherty amplifier architecture, a 90 degree phase shift is applied to the peaking signal prior to amplification along the peaking amplifier path, and a corresponding 90 degree phase shift and impedance inversion is applied to the carrier signal after amplification along the carrier amplifier path, and before the amplified carrier and peaking signals are combined together in phase at a combining node.

The carrier amplifier and the peaking amplifier each may be implemented using a single-stage or multiple-stage power transistor. Using nomenclature typically applied to field effect transistors (FETs), the carrier amplifier transistor and the peaking amplifier transistor each may include a control terminal (e.g., a gate) configured to receive an input RF signal, and two current conducting terminals (e.g., a drain terminal and a source terminal). In some configurations, each source terminal is coupled to a ground reference node, and the amplified carrier and peaking signals are provided at the drain terminals of the carrier amplifier transistor and the peaking amplifier transistor, respectively. The drain terminal of the peaking amplifier may serve as the combining node for the amplified RF signals produced by the carrier and peaking amplifiers.

To provide a 90-degree phase shift and an impedance inversion between the drain of the carrier amplifier and the combining node (e.g., at the drain of the peaking amplifier transistor), the drain of the carrier amplifier may be electrically coupled (e.g., with first wirebonds) to the first end of a transmission line, and the second end of the transmission line may be electrically coupled (e.g., with second wirebonds) to the drain of the peaking amplifier (e.g., the combining node). Such a configuration may be referred to as a "90/0" Doherty amplifier, because about 90 degrees of phase shift is applied to the amplified carrier signal before it reaches the combining node, whereas no substantial phase shift is applied to the peaking signal before it reaches the combining node.

In a 90/0 Doherty amplifier, the electrical length of the transmission line between the drain terminals of the carrier and peaking amplifier transistors is determined by the drain capacitances of the transistors and the first and second wirebonds interconnecting the drain terminals to the transmission line. Although a 90 degree total phase shift should be applied between the intrinsic drains of the carrier and peaking amplifier transistors, the electrical length of the transmission line typically has a fixed value that is less than 90 degrees. As such, some amplifier configurations incorporate a shunt inductance circuit coupled to the carrier amplifier transistor drain and/or to the peaking amplifier transistor drain. Essentially, the shunt inductance circuit is configured to allow for increases in the electrical length of the transmission line that interconnects the drain terminals, which in turn may enable the drain terminals to be placed farther apart to minimize coupling between the carrier and peaking paths. According to various embodiments, each of the power transistors in the main and peaking amplifiers may be implemented as enhancement-mode or depletion-mode high electron mobility transistors (HEMTs) using III-V semiconductor materials. For example, each transistor may be a III-V field effect transistor (FET), such as a gallium nitride (GaN) FET, or another type of III-V transistor, including a gallium arsenide (GaAs) FET, a gallium phosphide (GaP) FET, an indium phosphide (InP) FET, or an indium antimonide (InSb) FET). In this disclosure, example amplifier implementations are described that relate to GaN transistors, however, it should be understood that embodiments and discussions directed to GaN-based transistors are equally applicable to other types of III-V FETs.

Such technologies may be referred to as high-power or high-power-density technologies and transistors manufactured using such technologies may have reduced drain-source capacitance (Cds) values compared to LDMOS transistors, which may result in reduced effectiveness in terminating harmonic frequencies. For example, in a GaN transistor, Cds values can range from about 0.3 picoFarads (pF) to about 3 pF for 10 Watt (W) to 100 W devices. Consequently, Cds values in GaN-based transistors (and other high-power-density transistors) may be as much as 8 times or 10 times lower than Cds values in LDMOS transistors at comparable power levels. In a Doherty amplifier, this results in reduced Cds values for the amplifier's peaking and carrier power transistors, which can, in turn, result in inadequate harmonic termination as compared to amplifiers in an LDMOS implementation. Consequently, without proper carrier harmonic termination, both the efficiency and power output of Doherty amplifiers implemented using GaN or other III-V semiconductor technologies may be degraded. Accordingly, proper carrier harmonic termination is required in high-power Doherty amplifier applications.

To provide proper harmonic termination in amplifiers implemented using high power density transistors such as III-V FETs, an amplifier design is provided in which a series inductor-capacitor (LC) harmonic control circuit is connected at the Doherty amplifier's combining node. Specifically, the LC harmonic control circuit enables termination of carrier second and third order harmonics, where such harmonic termination may be required to achieve satisfactory RF performance at the amplifier's back-off and average power levels.

FIG. 1 is a schematic diagram of a Doherty amplifier 100, in accordance with an example embodiment. As indicated in FIG. 1 with box 110, some or all components of Doherty amplifier 100 may be implemented in a single device package or module. As will be explained in detail later, and in accordance with various embodiments, the configurations and orientations of the various amplifier components enable the size of the package or module to be significantly reduced when compared with conventional packaging techniques using conventional components. These miniaturization benefits may be realized while still meeting gain, linearity, stability, and efficiency performance criteria. In high-power/high-density applications (e.g., applications utilizing III-V FETs, such as GaN transistors), the drain-source capacitance of the transistors implementing the power amplifiers of Doherty amplifiers may be reduced compared to transistors implemented using LDMOS technologies. As such, the reduced Cds may not provide adequate harmonic termination in high-power/high-density applications. Consequently, Doherty amplifier 100 incorporates a harmonic termination circuit 191 to provide adequate second and third-order harmonic termination at output terminal 138 of Doherty amplifier 100's carrier amplifier 132.

Doherty amplifier 100 includes an RF input node 112, an RF output node 114, a power splitter 120, a carrier amplifier path 130, a peaking amplifier path 150, a phase delay and impedance inversion element 172, and a combining node 180, in an embodiment.

When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around a fundamental frequency ($f_0$). Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes a first phase shift element, which is configured to impart a first phase shift (e.g., about a 90 degree phase shift) to the peaking signal before it is provided to output 126. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. As shown in FIG. 1, in an embodiment, the connection between output 126 and the peaking amplifier path 150 crosses over the connection between output 124 and the carrier amplifier path 130. As will be conveyed later in conjunction with the discussion of FIG. 3, this cross-over configuration may enable further compaction and miniaturization of the amplifier 100 by enabling a compact arrangement of input circuits 170, 174. In an alternate embodiment, outputs 124 and 126 may be reversed, enabling the outputs 124 and 126 to be connected to the carrier and peaking paths 130, 150 without one connection crossing over the other connection.

The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive in phase with each other at the power combining node 180.

According to an embodiment, the carrier amplifier path 130 includes an input circuit 170 (e.g., including an impedance matching circuit), a carrier amplifier die 132, and a phase shift and impedance inversion element 172. In addition, and according to an embodiment, the carrier amplifier path 130 includes a first shunt inductance circuit 140 coupled between the output of the carrier amplifier die 132 (e.g., the drain terminal 338 of transistor 337, FIG. 3) and a terminal 145 configured for coupling with a ground reference voltage.

The carrier amplifier die 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120.

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal or the source terminal) is electrically connected to the RF output terminal 138, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low gain, and a second transistor functions as an output amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 138, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132 and/or electrically coupled to the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 138 of the carrier amplifier die 132 is coupled to the first shunt inductance circuit 140. The first shunt inductance circuit 140 includes a shunt inductance 142 coupled in series with a shunt capacitance 143. According to an embodiment, the first shunt inductance circuit 140 is configured so that an RF "cold point" is present at the node 144 between shunt inductor 142 and shunt capacitor 143. Accordingly, node 144 may be referred to herein as an "RF cold point node." More specifically, the capacitance of the shunt capacitor 143 is chosen to provide a virtual ground reference voltage for the RF electrical signals at node 144, such that inductive element 142 functions as a shunt inductance to the RF ground voltage. In addition, in an embodiment, the RF cold point node 144 is coupled to a drain bias voltage terminal 118, which may be coupled to a bias circuit for providing a DC bias voltage to the drain of the carrier amplifier die 132.

The RF output terminal 138 of the carrier amplifier die 132 also is coupled to the power combining node 180 through phase shift and impedance inversion element 172, in an embodiment. According to an embodiment, the impedance inversion element is a lambda/4 ($\lambda$/4) transmission line phase shift element (e.g., a microstrip line), which imparts about a 90-degree relative phase shift to the carrier signal after amplification by the carrier amplifier die 132. A first end of the impedance inversion element 172 is coupled to the RF output terminal 138 of the carrier amplifier die 132, and a second end of the phase shift element 172 is coupled to the power combining node 180.

Reference is now made to the peaking amplifier path 150, which includes a peaking amplifier die 152 and an input circuit 174 (e.g., including an impedance matching circuit), in an embodiment. In addition, and according to an embodiment, the peaking amplifier path 150 includes a second shunt inductance circuit 141 coupled between the output of the peaking amplifier die 152 (e.g., the drain terminal 358 of transistor 357, FIG. 3) and a terminal 149 configured for coupling with a ground reference voltage.

The peaking amplifier die 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 158 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 158 of the peaking amplifier die 152 is coupled to the power combining node 180. According to an embodiment, the RF output terminal 158 of the peaking amplifier die 152 and the combining node 180 are implemented with a common element. More specifically, in an embodiment, the RF output terminal 158 of the peaking amplifier die 152 is configured to function both as the combining node 180 and as the output terminal 158 of the peaking amplifier die 152. In addition, the RF output terminal 158 is configured to enable a connection between the second end of the phase shift and impedance inversion element 172 and the peaking amplifier die 152 (e.g., implemented with a wirebond array) to extend in a direction that is angularly offset from (e.g., perpendicular to) the direction of the input signal to the peaking amplifier die 152 (e.g., as indicated with arrow 150). This may be accomplished, for example, by providing an elongated input terminal 154 (e.g., gate terminal) that is angularly offset from (e.g., perpendicular to) an elongated portion of the output terminal 158 (e.g., drain terminal) to which the phase shift element 172 is coupled.

The RF output terminal 158 of the peaking amplifier die 152 is coupled to the second shunt inductance circuit 141. Similar to the first shunt inductance circuit, the second shunt inductance circuit 141 also includes a shunt inductance 146 coupled in series with a shunt capacitance 147. According to an embodiment, the second shunt inductance circuit 141 also includes an RF cold point node 148 between shunt inductor 146 and shunt capacitor 147. Again, the capacitance of the shunt capacitor 147 is chosen to provide a virtual ground reference voltage for the RF electrical signals at node 148, such that inductive element 146 functions as a shunt inductance to the RF ground voltage. In addition, in an embodiment, the RF cold point node 144 is coupled to a drain bias voltage terminal 117, which may be coupled to a bias circuit for providing a DC bias voltage to the drain of the peaking amplifier die 152.

Although both shunt inductance circuits 140, 141 may be included in the amplifier 100, in an embodiment, either of the shunt inductance circuits 140, 141 may be excluded from the amplifier 100, in other embodiments. In other words, one alternate embodiment of amplifier 100 may include shunt inductance circuit 140, and may exclude shunt inductance circuit 141, while another alternate embodiment of amplifier 100 may include shunt inductance circuit 141, and may exclude shunt inductance circuit 140.

In conventional embodiments of amplifier 100 in which the amplifiers of carrier amplifier die 132 and peaking amplifier die 152 are implemented using laterally-diffused metal-oxide semiconductor (LDMOS) transistors, inductive element 146 may be configured to provide amplifier fundamental frequency harmonic termination, with the Cds of carrier amplifier die 132 and peaking amplifier die 152 providing some higher-order harmonic termination. But when the transistors of carrier amplifier die 132 and peaking amplifier die 152 are implemented using other, relatively high-power and high-density semiconductor transistors, such as III-V FETs (e.g., 48 volt Gallium Nitride (GaN) transistors), the die have smaller geometry and the transistors have smaller Cds compared to those of LDMOS transistors. Consequently, the reduced Cds of the peaking amplifier die 152 may not provide adequate carrier harmonic termination and, specifically, second ($2*f_o$) and third ($3*f_o$) (and potentially, higher-order) harmonics originating at the carrier amplifier die 132 intrinsic drain and received at the amplifier 100's peaking amplifier drain terminal 158 or combining node 180.

As such, Doherty amplifier 100 is configured to include an additional harmonic termination circuit 191 for providing adequate harmonic termination of second and third-order harmonic loading at the carrier amplifier die 132 intrinsic drain.

Referring to FIG. 1, harmonic control circuit 191 is coupled between a ground reference voltage and combining node 180. Harmonic control circuit 191 includes inductor 192 that is coupled between combining node 180 and capacitor 193. Capacitor 193, in turn, is coupled between inductor 192 and a ground reference voltage. To provide adequate second and third-order harmonic termination, inductance 192 may have an inductance value that is approximately a third of the inductance value of inductor 146 of shunt inductance circuit 141. Capacitor 193 may have a capacitance value that is approximately 20 to 110 times smaller than capacitor 147 of shunt inductance circuit 141. In this configuration, during operation of amplifier 100, harmonic control circuit 191 operates as a short circuit to the ground reference voltage for carrier amplifier die 132 second and third harmonic signals. Harmonic control circuit 191 is coupled to combining node 180 (e.g., the output terminal 158 of peaking amplifier die 152) as opposed to the output terminal 138 of carrier amplifier die 132 to reduce requirements to optimize or adjust the impedance of impedance inversion element 172.

The amplified carrier and peaking RF signals combine in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier die 132, 152. The resulting amplified RF output signal is produced at RF output node 114, to which an output load 190 (e.g., an antenna) is connected.

Amplifier 100 is configured so that the carrier amplifier path 130 provides amplification for relatively low-level input signals, and both amplification paths 130, 150 operate in combination to provide amplification for relatively high-level input signals. This may be accomplished, for example, by biasing the carrier amplifier die 132 so that the carrier amplifier die 132 operates in a class AB mode, and biasing the peaking amplifier die 152 so that the peaking amplifier die 152 operates in a class C mode.

In the embodiment illustrated in FIG. 1 and described above, a first phase shift element in splitter 120 imparts about 90 degrees of phase shift to the peaking signal prior to amplification, and phase shift and impedance inversion element 172, in combination with the Cds of the transistor of carrier amplifier die 132 and the Cds of the transistor of peaking amplifier die 152, similarly imparts about 90 degrees of phase shift to the amplified carrier signal so that the amplified carrier and peaking signals may combine in phase at the combining node 180. Such an architecture is referred to as a non-inverted Doherty amplifier architecture. In an alternate embodiment, a first phase shift element in splitter 120 may impart about 90 degrees of phase shift to the carrier signal prior to amplification, rather than to the peaking signal, and phase shift and impedance inversion element 172 may be included instead at the output of the peaking amplifier. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 180. For example, phase shifts greater than 90 degrees may be applied along the carrier and peaking paths 130, 150.

According to an embodiment, the physical components of the carrier and peaking paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 138. Similarly, a portion of a second signal path through the peaking amplifier die 152 extends in a second direction (indicated by arrow 150) between the RF input and output terminals 154, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

Figure 2:
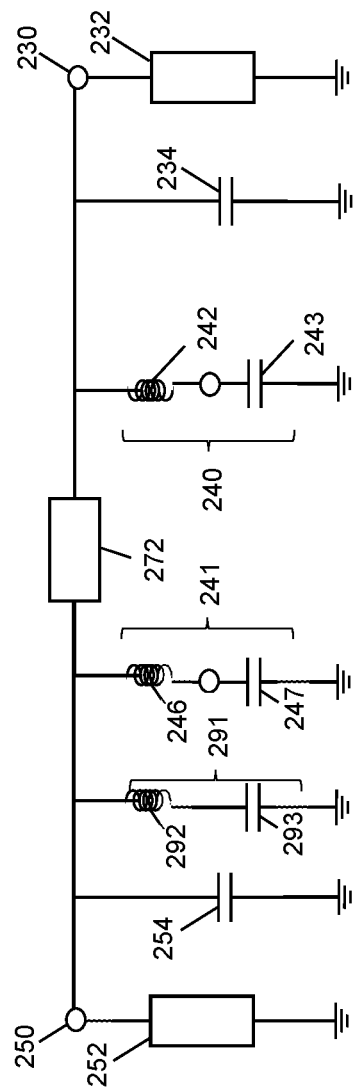
FIG. 2 is a schematic diagram representing the interconnection between the drain terminals of a carrier device and a peaking device, with a shunt inductance circuit to provide harmonic termination coupled between the drains, in accordance with an example embodiment.

FIG. 2 is a schematic diagram representing the interconnection between the intrinsic drain 230 of a carrier device 232 (e.g., a carrier amplifier of carrier amplifier die 132, FIG. 1) and intrinsic drain 250 of a peaking device 252 (e.g., a peaking amplifier of peaking amplifier die 152, FIG. 1), with shunt inductance circuits 240, 241 (e.g., shunt inductive circuits 140, 141, FIG. 2) configured to enable the inclusion of a longer transmission line 272 between the drains of the devices 232, 252, and harmonic termination circuit 291 (e.g., harmonic termination circuit 191, FIG. 1) for providing second and third order harmonic impedances at the intrinsic drain 230 of carrier device 232, in accordance with an example embodiment.

In FIG. 2, node 230 represents the intrinsic drain of a carrier device 232, and node 250 represents the intrinsic drain of a peaking device 252. Capacitor 234 represents the parasitic drain-source shunt capacitance of the carrier device 232, and capacitor 254 represents the parasitic drain-source shunt capacitance of the peaking device 250. Element 272 represents a phase shift and impedance inversion element (e.g., elements 172, 372, FIGS. 1, 3) interconnecting the drains of the carrier and peaking devices 232, 252, including wirebond arrays (e.g., arrays 361, 363, FIG. 3) connecting both ends of element 272 to the respective drain terminals. Shunt inductance circuits 240, 241 represent embodiments of first and second shunt inductance circuits coupled to the drains of the carrier and peaking devices 232, 252, respectively, and configured to enable adjustments to the electrical length (and thus the physical length) of the phase shift and impedance inversion element 272. Harmonic termination circuit 291 represents an embodiment of a harmonic termination circuit (e.g., harmonic termination circuit 191 of FIG. 1) coupled to the drain of peaking device 252 and configured to provide second and third order harmonic termination.

Inclusion of one or both shunt inductance circuits 240, 241, according to various embodiments, enables the electrical length (and the physical length) of the phase shift and impedance inversion element 272 to be increased significantly, while still maintaining the 90 degree total phase shift between the intrinsic drain nodes 230, 250.

Inclusion of harmonic termination circuit 291 enables improved harmonic termination, even in device configurations in which carrier device 232 and peaking device 252 are implemented using semiconductor technologies in which carrier device 232 and peaking device 252 have relatively small Cds 234 and 254, respectively.

For example, in an amplifier embodiment in which carrier device 232 and peaking device 252 are implemented using III-V FETs (e.g., GaN transistors) and operating at about 2.6 gigahertz (GHz) drain-source capacitances 234, 254 may have capacitance values of about 0.6 pF and 1.2 pF, respectively, shunt inductors 242, 246 have inductance values of about 2.0 to 3.5 nanohenries (nH) and shunt capacitors 243, 247 have values of about 22 pF. In that configuration, inductor 292 of harmonic control circuit 291 may have an inductance of about 0.5 to about 1.5 nH, while capacitor 293 has a capacitance of about 0.2 pF to about 1.2 pF. Accordingly, in various embodiments, the inductance of inductor 246 may be about 3.5 times greater than the inductance of inductor 292. In other embodiments, the inductance of inductor 246 may range from about 3 to about 4 times greater than the inductance of inductor 292, though other component values may be used in various embodiments. In various embodiments, the capacitance of capacitor 247 may be about 20 to 110 times greater than the capacitance of capacitor 293. In other embodiments, the capacitance of capacitor 247 may range from about 10 to about 130 times greater than the capacitance of capacitor 293, though other component values may be used in various embodiments. With components values in these ranges, a second order harmonic frequency (i.e., $2*f_0$) short circuit to ground and a capacitive load at $f_0$ are created at the amplifier's combining node. The short circuit at the combining node is rotated 90 degrees to be an open circuit at $f_0$ at the carrier device 232 intrinsic drain 230. At $2*f_0$, this rotation is 180 degrees so that the $2*f_0$ short circuit to ground at the combining node is also a $2*f_0$ short circuit to ground at the carrier device 232 intrinsic drain 230. In this manner, carrier device 232 is minimally loaded at $f_0$, but properly terminated at $2*f_0$.

Because the inductance and capacitance values of shunt inductance circuits 240, 241 are greater than the inductance and capacitance values of harmonic termination circuit 291, shunt inductance circuits 240, 241 are generally incapable of adequately terminating second and third order harmonics of signals at the intrinsic drain of peaking device 252. Accordingly, second and third order harmonic termination is provided by the separate harmonic control circuit 291, as depicted in FIG. 2.

Figure 3:
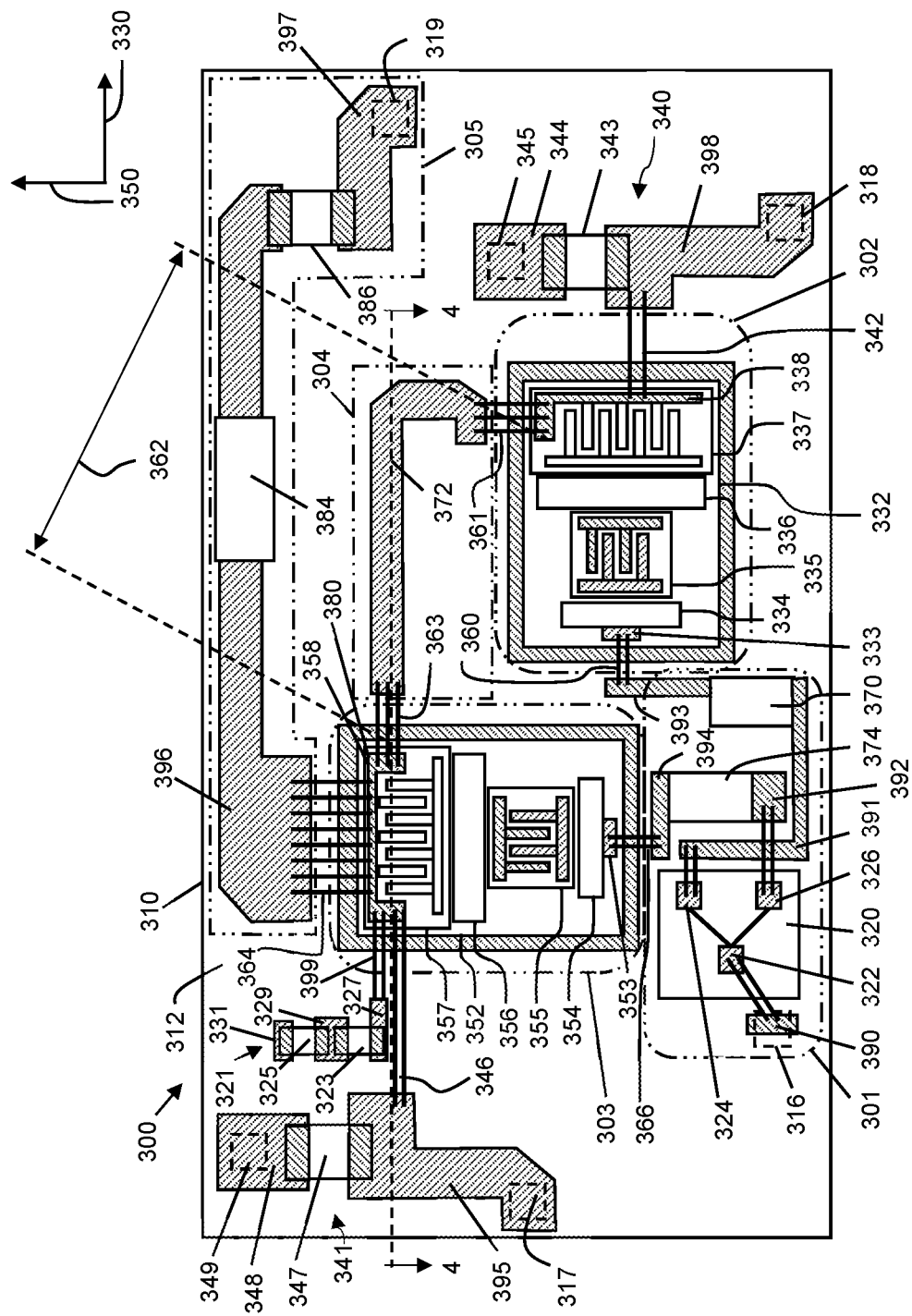
FIG. 3 is a top view of a Doherty amplifier module, in accordance with an example embodiment.
Figure 4:
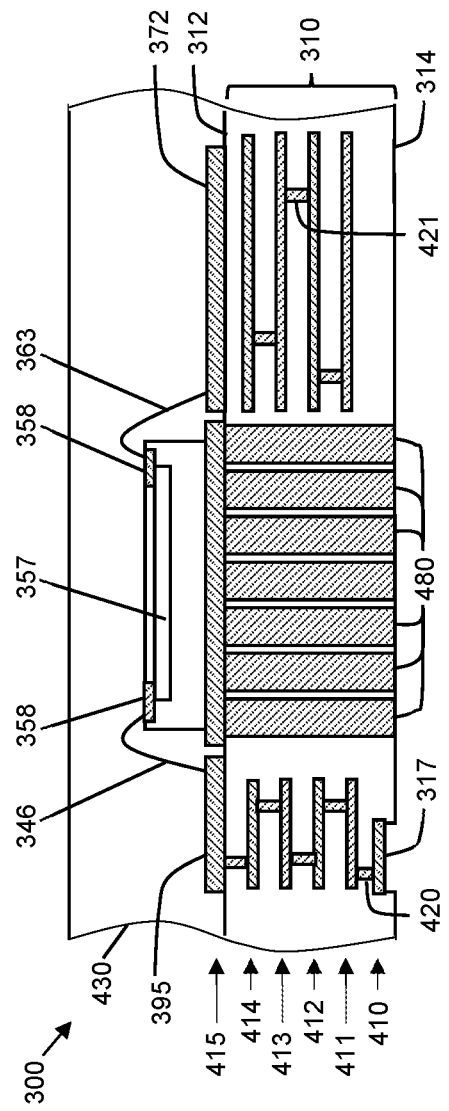
FIG. 4 is a cross-sectional, side view of the module of FIG. 3 taken along line 4-4.

An embodiment of a physical implementation of the Doherty amplifier circuit of FIG. 1 now will be described in detail in conjunction with FIGS. 3 and 4. More specifically, FIG. 3 is a top view of a Doherty amplifier module 300, in accordance with an example embodiment. FIG. 3 should be viewed simultaneously with FIG. 4, which is a cross-sectional, side view of a portion of the module 300 of FIG. 3 along line 4-4. Doherty amplifier module 300 includes a substrate 310, a power splitter 320 (e.g., power splitter 120, FIG. 1), a carrier amplifier die 332 (e.g., carrier amplifier die 132, FIG. 1), a peaking amplifier die 352 (e.g., peaking amplifier die 152, FIG. 1), a phase shift and impedance inversion element 372 (e.g., phase shift and impedance inversion element 172, FIG. 1), a first shunt impedance circuit 340 (e.g., circuit 140, FIG. 1) coupled to the carrier amplifier die 332, a second shunt impedance circuit 341 (e.g., circuit 141, FIG. 1) coupled to the peaking amplifier die 352, harmonic termination circuit 321 (e.g., circuit 321)

coupled to combining node 380 (e.g., node 180, FIG. 1) and various other circuit elements, which will be discussed in more detail below.

The Doherty amplifier module 300 may be implemented as a land grid array (LGA) module, for example. Accordingly, the substrate 310 has a component mounting surface 312 and a land surface 314. The component mounting surface 312 and the components mounted to that surface 312 optionally may be covered with an encapsulant material 430 (e.g., a plastic encapsulant). In an alternate embodiment, the components could be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 6 mm.

For example, the substrate 300 may be a multi-layer organic substrate (e.g., formed from PCB materials) with a plurality of metal layers 410, 411, 412, 413, 414, 415 which are separated by dielectric material. According to an embodiment, the bottom metal layer 410 is utilized to provide externally-accessible, conductive landing pads 316, 317, 318, 319, 345, 349 of the LGA, where the locations of some example landing pads 316-319, 345, 349 are indicated with dashed boxes in FIG. 3. These landing pads 316-319, 345, 349 (among others, not illustrated) enable surface mounting of the Doherty amplifier module 300 onto a separate substrate (not illustrated) that provides electrical connectivity to other portions of an RF system. Although module 300 is depicted as an LGA module, module 300 alternatively may be packaged as a pin grid array module, a quad flat no leads (QFN) module, or another type of package.

One or more other metal layers (e.g., layers 411, 412) of the substrate 310 may be used to convey DC voltages (e.g., DC bias voltages) and to provide a ground reference. Other layers (e.g., layers 413, 414) may be used to convey RF and other signals through the module 300. Additionally, a patterned metal layer 415 may be formed on the mounting surface 312 of the substrate 310. As will be discussed in more detail below, the patterned metal layer 415 may include a plurality of conductive contacts and traces 344, 348, 390-397 on the mounting surface 312, which facilitates electrical connection to die and other components that may be mounted to the mounting surface 312. In addition, a phase shift and impedance inversion element 372 may be formed from a portion of the patterned metal layer 415 (or from portions of one or more other conductive layers). Conductive vias (e.g., vias 420, 421) provide for electrical connectivity between the metal layers 410-415.

Each of the carrier and peaking amplifier die 332, 352 are monolithic power transistor integrated circuits (ICs) that may produce significant amounts of heat during operation. In addition, each of the carrier and peaking amplifier die 332, 352 also need access to a ground reference. Accordingly, in an embodiment, substrate 310 also includes a plurality of electrically and thermally conductive trenches 480 to which the carrier and peaking amplifier die 332, 352 are coupled (e.g., with solder, brazing material, silver sinter, or other die attach materials). The trenches 480 extend through the substrate thickness in first-die and second-die mounting zones 302, 303 to provide heat sinks and ground reference access to the carrier and peaking amplifier die 332, 352. For example, the conductive trenches 480 may be filled with copper or another thermally and electrically conductive material. In alternate embodiments, the trenches 480 may be replaced with conductive slugs (e.g., copper slugs) or with thermal vias.

Referring to the top view of module 300 in FIG. 3, a plurality of non-overlapping zones are defined at the mounting surface 312 of the substrate 310. More specifically, the non-overlapping zones include an input signal and splitter zone 301, a first-die mounting zone 302, a second-die mounting zone 303, an inter-amplifier impedance inverter zone 304, and an output match zone 305. Within the input signal and splitter zone 301, a conductive landing pad 316 exposed at the land surface 314 is electrically coupled through the substrate 310 to a conductive contact 390 at the mounting surface 312. The landing pad 316 and contact 390, along with the electrical connections between them, function as the RF input node (e.g., RF input node 112, FIG. 1) for the module 300.

The power splitter 320 is coupled to the mounting surface 312 in the input signal zone 301. According to an embodiment, the power splitter 320 may include one or more discrete die and/or components, although it is represented in FIG. 3 as a single element. The power splitter includes an input terminal 322 (e.g., input 122, FIG. 1) and two output terminals 324, 326 (e.g., outputs 124, 126, FIG. 1). The input terminal 322 is electrically coupled (e.g., through wirebonds, as shown) to conductive contact 390 to receive an input RF signal. In addition, the output terminals 324, 326 are electrically coupled (e.g., through additional wirebonds, as shown) to conductive contacts 391, 392 at the mounting surface 312. The power splitter 320 is configured to split the power of the input RF signal received through input terminal 322 into first and second RF signals (e.g., carrier and peaking signals), which are produced at the output terminals 324, 326. In addition, the power splitter 320 may include a first phase shift element configured to impart about a 90 degree phase shift to the RF signal provided at output terminal 326. As discussed previously, the power splitter 320 may consist of fixed-value, passive components, or the power splitter 320 may include variable phase shifters and/or attenuators (e.g., as with the power splitter 200, FIG. 2).

The first and second RF signals may have equal or unequal power, as discussed previously. The first RF signal produced at output terminal 324 and conveyed to conductive contact 391 is amplified through a carrier amplifier path. The carrier amplifier path includes an input circuit 370 (e.g., input circuit 170, FIG. 1) mounted within the input signal zone 301, a carrier amplifier die 332 (e.g., die 132, FIG. 1) mounted within the first-die mounting zone 302, an impedance inversion element 372 (e.g., impedance inversion element 172, FIG. 1) connected to the substrate 310 within the inter-amplifier impedance inverter zone 304, and a shunt inductance circuit 340 (e.g., shunt inductance circuit 140, FIG. 1) connected to the output terminal 338 of the carrier amplifier die 332.

The input circuit 370 is electrically connected between conductive contacts 391 and 393. Although the detail is not shown in FIG. 3, the input circuit 370 may include a plurality of discrete and/or integrated components (e.g., inductors and capacitors) configured to provide proper impedance matching between the first power splitter output 324 and the input to the carrier die 332.

Conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of carrier amplifier die 332 embodies a two-stage amplifier. More specifically, the electrical components of carrier amplifier die 332 include an RF input terminal 333, an input matching network 334, a driver transistor 335, an interstage matching network 336, an output transistor 337, and an RF output terminal 338. The driver and output transistors 335, 337 are coupled in series between the input and output terminals 333, 338. The driver transistor 335 is configured to apply a relatively low gain to the carrier signal, and the output transistor 337 is configured to apply a relatively high gain to the carrier signal after preliminary amplification by the driver transistor 335. In other embodiments, the carrier amplifier die 332 may embody a single stage amplifier, or may include more than two amplification stages.

Each of the transistors 335, 337 may be a field effect transistor (FET) implemented using high power density semiconductor technologies, such as GaN. Such technologies allow the geometrical size of transistors 335, 337 to be significantly reduced compared to the size of transistors implemented in LDMOS to provide the same power capabilities. For example, for the same power level, a GaN-based transistor may be one-tenth (1/10) the size of an LDMOS transistor configured for the same power level.

The input terminal 333 of die 332 is electrically coupled to the gate terminal of transistor 335 through input matching network 334, and the drain terminal of transistor 335 is electrically coupled to the gate terminal of transistor 337 through inter-stage matching network 336. According to an embodiment, the drain terminal of transistor 337 is electrically coupled to output terminal 338. Accordingly, the signal path through the carrier amplifier die 332 is in a direction extending from the RF input terminal 333 toward the RF output terminal 338, which direction is indicated by arrow 330.

An amplified RF carrier signal is produced by the carrier amplifier die 332 at the RF output terminal 338. In an embodiment, the RF output terminal 338 is electrically coupled to a first end of phase shift and impedance inversion element 372, which is at least partially exposed at the mounting surface 312, with a first wirebond array 361 (i.e., a plurality of parallel, closely spaced wirebonds).

In addition, according to an embodiment, the RF output terminal 338 is electrically coupled through a first shunt inductance circuit 340 to a landing pad 345. The first shunt inductance circuit 340 includes an inductive element (e.g., shunt inductive element 142, FIG. 1) in the form of a set of wirebonds 342, in series with a capacitor 343 (e.g., shunt capacitor 143, FIG. 1) in the form of a chip capacitor. The wirebonds 342 extend from the RF output terminal 338 to conductive trace 398. Capacitor 343 has a first terminal coupled to the conductive trace 398, and a second terminal coupled to conductive pad 344. The conductive pad 344 is electrically connected through the substrate 310 to landing pad 345. When integrated with a larger RF system, landing pad 345 may be connected to system ground.

According to an embodiment, the wirebonds 342 are configured to provide an inductance that enables the electrical and physical length of the phase shift and impedance inversion element 372 to be increased, in comparison with the electrical and physical length that may be used if the first shunt inductance circuit 340 were excluded from the module 300. For example, the wirebonds 342 may be configured to have an inductance value in a range of about 3 nH to about 4 nH, for example 3.5 nH, although the wirebonds 342 may be configured to have a smaller or larger inductance value, as well. Although the illustrated embodiment shows the shunt inductive element as a set of two wirebonds 342, other embodiments may include more or fewer wirebonds to achieve a desired inductance value. Further, the inductance value may be controlled through variation of the loop heights of the wirebonds 342.

As discussed previously, the shunt capacitor 343 has a capacitance value that is chosen to provide a virtual ground reference voltage for the RF electrical signals at conductive trace 398, such that wirebonds 342 function as a shunt inductance to the RF ground voltage. Desirably, the shunt capacitor 343 is series resonant in band. For example, shunt capacitor 343 may have a capacitance value of about 15 pF to about 27 pF, for example 22 pF, or more specifically in a range of about 20 pF to about 24 pF, although the capacitance value may be smaller or larger, as well.

Because trace 398 corresponds to an RF cold point node, in an embodiment, trace 398 may be used to provide a DC bias voltage to the output terminal 338 of transistor 337. Accordingly, in an embodiment, trace 398 also may be coupled through the substrate 310 to landing pad 318. Landing pad 318, in turn, may be coupled to a drain bias circuit in the RF system to which module 300 ultimately is connected.

According to an embodiment, the RF output terminal 338 of carrier amplifier die 332 includes an elongated first pad that is configured to enable wirebonds 361 to be connected to the first pad so that the wirebonds 361 extend in a direction that is angularly offset from (e.g., perpendicular to) the direction of the signal path through the carrier amplifier die 332 (e.g., wirebonds 361 may extend in the direction indicated by arrow 350). Further, the RF output terminal 338 may include an elongated second pad that is configured to enable the wirebonds 342 corresponding to the shunt inductive element of the shunt inductance circuit 340 to be connected to the second pad so that the wirebonds 342 extend in a direction that is substantially parallel to the direction of the signal path through the carrier amplifier die 332 (i.e., wirebonds 342 may extend in the direction indicated by arrow 330). As illustrated in FIG. 3, the wirebonds of the wirebond array 342 are aligned in the same direction as the RF signal path through the carrier amplifier die 332 (e.g., in the direction indicated by arrow 330). In an embodiment, wirebond arrays 342, 361 are perpendicularly arranged with respect to each other at adjacent sides of die 332.

As mentioned above, through the wirebond array 361, the RF output terminal 338 is electrically coupled to phase shift and impedance inversion element 372, which is located in the inter-amplifier impedance inverter zone 304. According to an embodiment, phase shift and impedance inversion element 372 is implemented with a transmission line (e.g., a microstrip line) having an electrical length of about lambda/4 ($\lambda/4$) or less. The transmission line has a first end that is proximate to the carrier amplifier die 332 (and more particularly within a wirebond length of the RF output terminal 338), and a second end that is proximate to the peaking amplifier die 352 (and more particularly within a wirebond length of the RF output terminal 358 of the peaking amplifier die 352). As used herein, "within a wirebond length" means within a distance between about 125 microns and about 200 microns, although the term may mean a smaller or larger distance, as well. According to an embodiment, the phase shift and impedance inversion element 372 may be formed from a portion of one or more of the metal layers of the module substrate 310 (e.g., one or both of layers 413 and/or 414, FIG. 4), and/or may be formed on a surface of the module substrate 310.

Moving back to the power splitter 320 in the input signal and splitter zone 301, the second RF signal (i.e., the peaking signal) produced at output terminal 326 of the power splitter 320 and conveyed to conductive contact 392 is amplified through a peaking amplifier path. The peaking amplifier path includes input circuit 374 within the input signal and splitter zone 301, a peaking amplifier die 352 (e.g., die 152, FIG. 1) mounted within the second-die mounting zone 303, and a shunt inductance circuit 341 (e.g., shunt inductance circuit 141, FIG. 1) connected to the output terminal 358 of the peaking amplifier die 352. As mentioned above, the power splitter 320 may impart about a 90 degree phase shift to the RF signal provided at output terminal 326. Accordingly, the phase of the peaking signal received at input terminal 353 of peaking die 352 is delayed by about 90 degrees with respect to the carrier signal received at input terminal 333 of carrier die 332.

The input circuit 374 is electrically connected between conductive contacts 392 and 394. Although the detail is not shown in FIG. 3, the input circuit 374 may include a plurality of discrete and/or integrated components (e.g., inductors and capacitors) configured to provide proper impedance matching between the second power splitter output 326 and the input to the peaking die 352. As shown in FIG. 3, the conductive contacts 391-394 and the input circuits 370, 374 are arranged so that the circuitry within the input signal and splitter zone 301 can be very compact. More specifically, the circuitry is arranged so that the output terminal 326 that produces the peaking signal is farther from the peaking amplifier die 352 than the output terminal 324 that produces the carrier signal. In addition, the conductive path between the output terminal 326 and the RF input terminal 353 of the peaking amplifier die 352 crosses over the conductive path between the output terminal 324 and the RF input terminal 333 of the carrier amplifier die 332 (although a cross-under also could be implemented). This cross-over is accomplished through the wirebonds (not numbered) that electrically couple power splitter output 326 to conductive contact 392. In other embodiments, relatively compact circuitry may be achieved without the cross-over/cross-under configuration shown in FIG. 3. More specifically, the conductive path between the output terminal 326 and the RF input terminal 353 of the peaking amplifier die 352 may be configured so that it does not cross over (or under) the conductive path between the output terminal 324 and the RF input terminal 333 of the carrier amplifier die 332, in other embodiments.

Conductive contact 394 is electrically coupled (e.g., with wirebonds 366) to an RF input terminal 353 of the peaking amplifier die 352, in order to provide an RF carrier signal for amplification to the peaking amplifier die 352. The illustrated embodiment of peaking amplifier die 352 also embodies a two-stage amplifier. More specifically, the electrical components of peaking amplifier die 352 include an RF input terminal 353, an input matching network 354, a driver transistor 355, an interstage matching network 356, an output transistor 357, and an RF output terminal 358. The driver and output transistors 355, 357 are coupled in series between the input and output terminals 353, 358. The driver transistor 355 is configured to apply a relatively low gain to the peaking signal, and the output transistor 357 is configured to apply a relatively high gain to the peaking signal after preliminary amplification by the driver transistor 355.

In other embodiments, the peaking amplifier die 352 may embody a single stage amplifier, or may include more than two amplification stages. Again, each of the transistors 355, 357 may be a FET or a BJT.

The input terminal 353 of die 352 is electrically coupled to the gate terminal of transistor 355 through input matching network 354, and the drain terminal of transistor 355 is electrically coupled to the gate terminal of transistor 357 through inter-stage matching network 356. According to an embodiment, the drain terminal of transistor 357 is electrically coupled to output terminal 358. Accordingly, the signal path through the carrier amplifier die 352 is in a direction extending from RF input terminal 353 toward RF output terminal 358, which direction is indicated by arrow 350.

An amplified RF peaking signal is produced by the peaking amplifier die 352 at the RF output terminal 358. In an embodiment, and as mentioned above, the RF output terminal 358 is electrically coupled to impedance inversion element 372 with wirebond array 363, and RF output terminal 358 functions as a combining node 380 (e.g., combining node 180, FIG. 1) at which the amplified and delayed carrier amplifier signal is combined, in phase, with an amplified peaking amplifier signal.

In addition, according to an embodiment, the RF output terminal 358 is electrically coupled through a second shunt inductance circuit 341 to a landing pad 349. The second shunt inductance circuit 341 includes an inductive element (e.g., shunt inductive element 146, FIG. 1) in the form of a set of wirebonds 346, in series with a capacitor 347 (e.g., shunt capacitor 147, FIG. 1) in the form of a chip capacitor. The wirebonds 346 extend from the RF output terminal 358 to conductive trace 395. Capacitor 347 has a first terminal coupled to the conductive trace 395, and a second terminal coupled to conductive pad 348. The conductive pad 348 is electrically connected through the substrate 310 to landing pad 349. When integrated with a larger RF system, landing pad 349 may be connected to system ground.

According to an embodiment, the wirebonds 346 are configured to enable the electrical and physical length of the phase shift and impedance inversion element 372 to be increased, in comparison with the electrical and physical length that may be used if the first shunt inductance circuit 341 were excluded from the module 300. For example, the wirebonds 346 may be configured to have an inductance value in a range of about 3 nH to about 4 nH (e.g., 3.5 nH), although the wirebonds 346 may be configured to have a smaller or larger inductance value, as well. Although the illustrated embodiment shows the shunt inductive element as a set of two wirebonds 346, other embodiments may include more or fewer wirebonds to achieve a desired inductance value. Further, the inductance value may be controlled through variation of the loop heights of the wirebonds 346.

As discussed previously, the shunt capacitor 347 has a capacitance value that is chosen to provide a virtual ground reference voltage for the RF electrical signals at conductive trace 395, such that wirebonds 346 function as a shunt inductance to the RF ground voltage. Desirably, the shunt capacitor 347 is series resonant in band. For example, shunt capacitor 347 may have a capacitance value of about 22 pF, although the capacitance value may be smaller or larger, as well.

Because trace 395 corresponds to an RF cold point node, in an embodiment, trace 395 may be used to provide a DC bias voltage to the output terminal 358 of transistor 357. Accordingly, in an embodiment, trace 395 also may be coupled through the substrate 310 to landing pad 317.

Landing pad 317, in turn, may be coupled to a drain bias circuit in the RF system to which module 300 ultimately is connected.

The RF output terminal 358 of peaking amplifier die 352 includes an elongated first pad that is configured to enable wirebonds of a first wirebond array 363 to be connected to the first pad so that the wirebonds extend in a direction that is angularly offset from (e.g., perpendicular to) the direction of the signal path through the peaking amplifier die 352 (e.g., wirebonds 363 may extend in the direction indicated by arrow 330). Further, the RF output terminal 358 may include an elongated second pad that is configured to enable the wirebonds of the second wirebond array 364 to be connected to the second pad so that the wirebonds extend in a direction that is substantially parallel to the direction of the signal path through the carrier amplifier die 352 (i.e., wirebonds 364 may extend in the direction indicated by arrow 350). Further still, the RF output terminal 358 of peaking amplifier die 352 may include an elongated third pad that is configured to enable wirebonds of a third wirebond array 346 to be connected to the third pad so that the wirebonds extend in a direction that is angularly offset from (e.g., perpendicular to) the direction of the signal path through the peaking amplifier die 352 (e.g., wirebonds 346 may extend in a direction that is 180 degrees offset from the direction indicated by arrow 330).

The signal path through the peaking amplifier die 352 is in a direction extending from the RF input terminal 353 to the RF output terminal 358, which direction is indicated by arrow 350. As can be seen in FIG. 3, the signal paths through the peaking and carrier amplifier die 352, 332 extend in significantly different directions, and more particularly the signal paths are perpendicular in the embodiment of FIG. 3.

Harmonic control circuit 321 (e.g., harmonic control circuit 191, FIG. 1 or harmonic control circuit 291, FIG. 2) is coupled to RF output terminal 358 of peaking amplifier die 352. Harmonic control circuit 321 includes an inductor 323 (e.g., inductor 192, FIG. 1 or inductor 292, FIG. 2) coupled at a first terminal to conductive pad 327 which is, in turn, coupled to RF output terminal 358 by wirebond array 399 or another electrical interconnect, such as a conductive trace. A second terminal of inductor 323 is coupled to conductive pad 329 which is, in turn, coupled to a first terminal of capacitor 325 (e.g., capacitor 193, FIG. 1 or capacitor 293, FIG. 2). A second terminal of capacitor 325 is coupled to conductive pad 331. Conductive pad 331 can be electrically connected through the substrate 310 to a conductive trace that, in turn, may be connected to system ground reference node or voltage.

Each of inductor 323 and capacitor 325 may comprise discrete components, such as surface-mount chip or IC-based components, that are mounted or otherwise coupled, respectively, to a surface of conductive pads 327, 329, and 331 using any suitable surface mount techniques. In various embodiments, the inductance value of inductor 323 is selected to take into account any self-inductance of wirebond array 399. Also, in some embodiments, to minimize potential mutual inductance that may arise between wirebond arrays 399 and 346, wirebond arrays 399 and 346 may be arranged within device 300 so that the wirebond arrays 399 and 346 do not run parallel to one another and are instead rotationally offset from one another.

According to an embodiment, except for the configurations of the RF output terminals 338, 358, the peaking amplifier die 352 may be structurally identical to the carrier amplifier die 332, meaning that the two die 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and portions of the RF output terminal 338, 358 may be proximate to the second side of the die. The first sides of each die 332, 352 are oriented toward the input signal zone 301, and the first sides of the die 332, 352 are perpendicularly arranged, with respect to each other, in an embodiment. Said another way, the structurally identical carrier and peaking amplifier die 332, 352 are coupled to the mounting surface 312 of the substrate 310 so that the die 332, 352 are perpendicular to each other, rendering the RF signal paths through the die 332, 352 also perpendicular to each other. Even though the die 332, 352 may be positioned relatively close together, their perpendicular orientations may significantly reduce coupling between signals carried through and amplified by the die 332, 352.

As mentioned above, through the wirebond array 363, the RF output terminal 358 is electrically coupled to phase shift and impedance inversion element 372. Accordingly, the amplified carrier signal produced by the carrier amplifier die 332 is received at the RF output terminal 358 of the peaking amplifier die 352 through wirebond array 361, phase shift and impedance inversion element 372, and wirebond array 363. The amplified peaking signal produced by the peaking amplifier die 352 also is received at the RF output terminal 358, and the module 300 is configured so that the amplified carrier and peaking signals arrive and are combined at output terminal 358 (or combining node 380) in phase with each other.

According to an embodiment, the RF output terminal 358 (or combining node 380) is electrically coupled to conductive output trace 396 at the mounting surface 312 with wirebond array 364. As illustrated in FIG. 3, the wirebonds of the wirebond array 364 are aligned in the same direction as the RF signal path through the peaking amplifier die 352 (e.g., in the direction indicated by arrow 350). In an embodiment, wirebond arrays 363, 364 are perpendicularly arranged with respect to each other at adjacent sides of die 352, wirebond arrays 346, 364 also are perpendicularly arranged with respect to each other at adjacent sides of die 352, and wirebond arrays 363, 346 are arranged in parallel with each other at opposing sides of the peaking amplifier die 352. Accordingly, even though the wirebond arrays 363, 364 and wirebond arrays 346, 364 may be positioned relatively close together, their perpendicular orientations may significantly reduce coupling of RF signals carried through the wirebond arrays 346, 363, 364.

An output impedance matching network 384 and/or a decoupling capacitor 386 may be coupled along output trace 396, in an embodiment. The output impedance matching network 384 functions to present the proper load impedance to combining node 380. Although the detail is not shown in FIG. 3, the output impedance matching network 384 may include various discrete and/or integrated components (e.g., capacitors, inductors, and/or resistors) to provide the desired impedance matching. The output impedance matching network 384 is electrically coupled through the substrate 310 to conductive landing pad 319 exposed at the land surface 314. The landing pad 319 functions as the RF output node (e.g., RF output node 114, FIG. 1) for the module 300.

Besides the bias circuitry connections previously discussed (e.g., including elements 317, 318, 395, 398), module 300 also may include additional bias circuitry and/or bias circuitry connections configured to provide gate and drain bias voltages to some or all of the driver and output transistors 335, 355, 337, 357. For example, the bias circuitry may include, among other things, a plurality of landing pads (at the land surface 314 of the substrate 310), contacts (at the mounting surface 312 of the substrate 310), and other conductive structures and circuitry. Bias voltages provided to the gates and/or drains of the transistors 335, 355, 337, 357 facilitate Doherty operation of the module. For example, the transistors 335, 337 of the carrier amplifier die 332 may be biased to operate in class AB mode, and the transistors 355, 357 of the peaking amplifier die 352 may be biased to operate in class C mode. The above-described configuration corresponds to a non-inverted Doherty amplifier. In an alternate embodiment, modifications could be made to configure the module 300 to function as an inverted Doherty amplifier.

The above-described embodiments include two-way Doherty power amplifier implementations, which include a carrier amplifier and one peaking amplifier. According to other embodiments, a Doherty power amplifier may include more than one peaking amplifier, or module 300 may be modified to implement types of amplifiers other than Doherty amplifiers. Said another way, modules configured to include shunt inductance circuits for at least partially resonating out output drain-source capacitances of the amplifiers' transistors thus may be utilized in amplifier configurations other than those illustrated and discussed herein.

Various modifications may be made to module 300 without departing from the scope of the inventive subject matter. For example, although substrate 310 is depicted, in FIG. 4, to include five metal layers 410-414, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. Further still, the carrier and peaking amplifier die 332, 352 and/or certain ones of the various sets of wirebond arrays 342, 346, 360, 361, 363, 364 may be arranged in non-perpendicular manners, so long as there is a significant angular separation (e.g., an angular separation of 45 degrees or more) between their respective orientations (e.g., between arrays 361 and 342, between arrays 363 and 364, and between arrays 364 and 346). In addition, each of the carrier and peaking amplifier die 332, 352 may include single stage amplifiers, or two distinct amplifier die (one driver amplifier die and one output amplifier die) may be implemented along each path 330, 350.

Although FIG. 3 illustrates an embodiment in which shunt inductance circuits 340, 341 are coupled to both the carrier amplifier die 332 and the peaking amplifier die 352, other embodiments may include a shunt inductance circuit coupled only to one of the carrier or peaking die.

In an embodiment, an amplifier module includes a substrate with a mounting surface, and a first power transistor die coupled to the mounting surface. The first power transistor die includes a first transistor integrated within the first power transistor die. The first transistor includes a first drain terminal and a first intrinsic drain node corresponding to the first drain terminal. The amplifier module includes a second power transistor die coupled to the mounting surface. The second power transistor die includes a second transistor integrated within the second power transistor die. The second transistor includes a second drain terminal and a second intrinsic drain node corresponding to the second drain terminal. The amplifier module includes a phase shift and impedance inversion element connected between the first drain terminal and the second drain terminal, a first shunt inductance circuit coupled to the second drain terminal, and a harmonic control circuit coupled to the second drain terminal. The harmonic control circuit includes an inductor and a capacitor and the inductor and the capacitor are connected in series to the second drain terminal.

In an embodiment, a first terminal of the inductor is coupled to the second drain terminal by a first wirebond array, a second terminal of the inductor is coupled to a first terminal of the capacitor, and a second terminal of the capacitor is coupled to a ground reference node. In an embodiment, an inductance value of the inductor of the harmonic control circuit and a capacitance value of the capacitor of the harmonic control circuit are selected to terminate second order harmonic components of a fundamental frequency of a signal input to the second drain terminal. In an embodiment, the first inductance value of the first shunt inductance is at least three times greater than the inductance value of the inductor of the harmonic control circuit. In an embodiment, the inductance value of the inductor of the harmonic control circuit is in a range of 0.5 nanohenries to 1.5 nanohenries. In an embodiment, the first shunt inductance circuit has a capacitance value and the capacitance value of the first shunt inductance circuit is at least 10 times greater than a capacitance value of the capacitor of the harmonic control circuit. In an embodiment, the capacitance value of the capacitor of the harmonic control circuit is in a range from 0.2 picofarad to 1.2 picofarads. In an embodiment, the inductor of the harmonic control circuit is a first discrete component mounted to the substrate and the capacitor of the harmonic control circuit is a second discrete component mounted to the substrate. In an embodiment, the first power transistor die is a carrier amplifier die of a Doherty power amplifier, and the second power transistor die is a peaking amplifier die of the Doherty power amplifier. In an embodiment, the first power transistor die and the second power transistor die are made from a III-V semiconductor material.

In an embodiment, an amplifier module includes a substrate, and a first power transistor die on the substrate. The first power transistor die includes a first drain terminal. The amplifier module includes a second power transistor die coupled to the mounting surface. The second power transistor die includes a second drain terminal. The amplifier module includes a transmission line connected between the first drain terminal and the second drain terminal, and a harmonic control circuit coupled to the second drain terminal. The harmonic control circuit includes an inductor and a capacitor and the inductor and capacitor are connected in series between the first current conducting terminal and a ground reference node. An inductance value of the inductor of the harmonic control circuit and a capacitance value of the capacitor of the harmonic control circuit are selected to terminate second order harmonic components of a fundamental frequency of a signal input to the second drain terminal.

The amplifier module may further include a shunt inductance circuit coupled to the second drain terminal. In an embodiment, an inductance value of the first shunt inductance is at least three times greater than the inductance value of the inductor of the harmonic control circuit. In an embodiment, the shunt inductance circuit has a capacitance value and the capacitance value of the first shunt inductance circuit is at least 10 times greater than a capacitance value of the capacitor of the harmonic control circuit. In an embodiment, the first power transistor die is a carrier amplifier die of a Doherty power amplifier, and the second power transistor die is a peaking amplifier die of the Doherty power amplifier. In an embodiment, the first power transistor die and the second power transistor die are made from gallium nitride.

In an embodiment, a Doherty amplifier includes a peaking amplifier, a carrier amplifier, a combining node electrically connected to the carrier amplifier and the peaking amplifier, and a harmonic control circuit coupled to the combining node. The harmonic control circuit includes an inductor and a capacitor and the inductor and capacitor are connected in series between the first current conducting terminal and a ground reference node. An inductance value of the inductor of the harmonic control circuit and a capacitance value of the capacitor of the harmonic control circuit are selected to terminate second order harmonic components of a fundamental frequency of a signal generated by the carrier amplifier.

The Doherty amplifier may further include a shunt inductance circuit coupled to the combining node. In an embodiment, an inductance value of the first shunt inductance is at least three times greater than the inductance value of the inductor of the harmonic control circuit. In an embodiment, a capacitance value of the shunt inductance circuit is at least 10 times greater than a capacitance value of the capacitor of the harmonic control circuit.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier module comprising:
   a substrate with a mounting surface;
   a first power transistor die coupled to the mounting surface, wherein the first power transistor die includes a first transistor integrated within the first power transistor die, and wherein the first transistor includes a first drain terminal and a first intrinsic drain node corresponding to the first drain terminal;
   a second power transistor die coupled to the mounting surface, wherein the second power transistor die includes a second transistor integrated within the second power transistor die, and wherein the second transistor includes a second drain terminal and a second intrinsic drain node corresponding to the second drain terminal;
   a phase shift and impedance inversion element connected between the first drain terminal and the second drain terminal;
   a first shunt inductance circuit coupled to the second drain terminal; and
   a harmonic control circuit coupled to the second drain terminal, wherein the harmonic control circuit includes an inductor and a capacitor and the inductor and the capacitor are connected in series to the second drain terminal, wherein a first terminal of the inductor is coupled to the first drain terminal and a second terminal of the inductor is coupled to a first terminal of the capacitor.

2. The amplifier module of claim 1, wherein the first terminal of the inductor is coupled to the second drain terminal by a first wirebond array and a second terminal of the capacitor is coupled to a ground reference node.

3. The amplifier module of claim 1, wherein an inductance value of the inductor of the harmonic control circuit and a capacitance value of the capacitor of the harmonic control circuit are selected to terminate second order harmonic components of a fundamental frequency of a signal input to the second drain terminal.

4. The amplifier module of claim 3, wherein the first inductance value of the first shunt inductance is at least three times greater than the inductance value of the inductor of the harmonic control circuit.

5. The amplifier module of claim 4, wherein the inductance value of the inductor of the harmonic control circuit is in a range of 0.5 nanohenries to 1.5 nanohenries.

6. The amplifier module of claim 3, wherein the first shunt inductance circuit has a capacitance value and the capacitance value of the first shunt inductance circuit is at least 10 times greater than a capacitance value of the capacitor of the harmonic control circuit.

7. The amplifier module of claim 6, wherein the capacitance value of the capacitor of the harmonic control circuit is in a range from 0.2 picofarad to 1.2 picofarads.

8. The amplifier module of claim 1, wherein the inductor of the harmonic control circuit is a first discrete component mounted to the substrate and the capacitor of the harmonic control circuit is a second discrete component mounted to the substrate.

9. The amplifier module of claim 1, wherein the first power transistor die is a carrier amplifier die of a Doherty power amplifier, and the second power transistor die is a peaking amplifier die of the Doherty power amplifier.

10. The amplifier module of claim 1, wherein the first power transistor die and the second power transistor die are made from a III-V semiconductor material.

11. An amplifier module, comprising:
a substrate;
a first power transistor die on the substrate, wherein the first power transistor die includes a first drain terminal;
a second power transistor die coupled to the mounting surface, wherein the second power transistor die includes a second drain terminal;
a transmission line connected between the first drain terminal and the second drain terminal; and
a harmonic control circuit coupled to the second drain terminal, wherein the harmonic control circuit includes an inductor and a capacitor and the inductor and capacitor are connected in series between the first drain terminal and a ground reference node, wherein the inductor is connected between the first drain terminal and the capacitor, and an inductance value of the inductor of the harmonic control circuit and a capacitance value of the capacitor of the harmonic control circuit are selected to terminate second order harmonic components of a fundamental frequency of a signal input to the second drain terminal.

12. The amplifier module of claim 11, further comprising a shunt inductance circuit coupled to the second drain terminal.

13. The amplifier module of claim 12, wherein an inductance value of the first shunt inductance is at least three times greater than the inductance value of the inductor of the harmonic control circuit.

14. The amplifier module of claim 11, wherein the shunt inductance circuit has a capacitance value and the capacitance value of the first shunt inductance circuit is at least 10 times greater than a capacitance value of the capacitor of the harmonic control circuit.

15. The amplifier module of claim 11, wherein the first power transistor die is a carrier amplifier die of a Doherty power amplifier, and the second power transistor die is a peaking amplifier die of the Doherty power amplifier.

16. The amplifier module of claim 11, wherein the first power transistor die and the second power transistor die are made from gallium nitride.

17. A Doherty amplifier, comprising:
a peaking amplifier;
a carrier amplifier;
a combining node electrically connected to the carrier amplifier and the peaking amplifier; and
a harmonic control circuit coupled to the combining node, wherein the harmonic control circuit includes an inductor and a capacitor and the inductor and capacitor are connected in series between the first drain terminal and a ground reference node, wherein the inductor is connected between the first drain terminal and the capacitor, and an inductance value of the inductor of the harmonic control circuit and a capacitance value of the capacitor of the harmonic control circuit are selected to terminate second order harmonic components of a fundamental frequency of a signal generated by the carrier amplifier.

18. The Doherty amplifier of claim 17, further comprising a shunt inductance circuit coupled to the combining node.

19. The Doherty amplifier of claim 18, wherein an inductance value of the first shunt inductance is at least three times greater than the inductance value of the inductor of the harmonic control circuit.

20. The Doherty amplifier of claim 18, wherein a capacitance value of the shunt inductance circuit is at least 10 times greater than a capacitance value of the capacitor of the harmonic control circuit.

* * * * *